United States Patent [19]
Behzad

[11] Patent Number: 6,014,045
[45] Date of Patent: Jan. 11, 2000

[54] MINIMAL HEADROOM, MINIMAL AREA MULTI-TERMINAL CURRENT STEERING CIRCUITS

[75] Inventor: Arya R. Behzad, Danville, Calif.

[73] Assignee: Maxim Integrated Products, Inc., Sunnyvale, Calif.

[21] Appl. No.: 09/089,651

[22] Filed: Jun. 3, 1998

[51] Int. Cl.[7] .................................................. H03K 5/153
[52] U.S. Cl. ............................................. 327/89; 327/417
[58] Field of Search ................................ 327/82, 89, 560, 327/563, 415, 417

[56] References Cited

U.S. PATENT DOCUMENTS

| | | | |
|---|---|---|---|
| 5,552,742 | 9/1996 | Perkins | 327/563 |
| 5,694,031 | 12/1997 | Stanojevic | 323/313 |
| 5,790,060 | 8/1998 | Tesch | 341/119 |
| 5,825,239 | 10/1998 | Adal | 327/563 |

*Primary Examiner*—Terry D. Cunningham
*Assistant Examiner*—Maria Hasanzadah
*Attorney, Agent, or Firm*—Blakely, Sokoloff, Taylor & Zafman LLP

[57] ABSTRACT

Minimal headroom, minimal area, multi-terminal current steering circuits for steering a current from a current source to any one of a plurality of outputs. The steering circuit provides controls to individual steering transistors so as to turn on the selected one of the plurality of steering transistors responsive to steering control signals. Minimal headroom is required, and beta dependent errors in the current output are minimized, by steering the current source through only a single transistor to the selected output. This also minimizes chip area. Alternate embodiments are disclosed and described.

7 Claims, 2 Drawing Sheets

MINIMAL HEADROOM, MINIMAL AREA MULTI-TERMINAL CURRENT STEERING CIRCUITS

BACKGROUND OF THE INVENTION

1. Field of the Invention

The present invention relates to the field of current steering circuits.

2. Prior Art

In various circuits, it may be required for a current to be steered to one of several sub-circuits, depending on one or more logic control bits. By way of example, in a specific product in which the present invention is intended to be used, it is required to be able to selectively turn on any one of multiple output stages of the integrated circuit device, more specifically to turn on one out of three different output stages, by selectively providing a tail current to the output stage intended to be activated. In such circuits it is desired to provide the selective current steering through the use of minimal integrated circuit die area to minimize the cost associated therewith. Further, because of the general desire to operate devices on lower power supply voltages, it is also desired to provide a current steering circuit in which minimal power supply headroom is required. Finally, current steering capabilities without compounding the effects of beta dependent base currents in the steering circuits is desired. The present invention provides a method and apparatus to achieve the goal of minimal supply headroom and minimal die area requirements with minimal beta dependent errors.

Various techniques are well known for steering a single current source to any of multiple outputs. By way of example, a single current source may be connected to the common emitter connection of a first differential pair of transistors so that the differential voltage applied to the bases of the differential pair may be used to controllably direct the current through either transistor of the first transistor pair. The collectors of the transistors of the first transistor pair may be connected to provide the tail current to second and third transistor pairs, a second differential control voltage connected to the bases of the transistors of the second and third transistor pairs determining which transistor in each of the second and third transistor pairs is turned on. In this manner, the first control voltage determines which of the transistors of the first transistor pair is turned on to provide tail current to the second or to the third transistor pair. The second control voltage determines which transistor of each of the second and third transistor pairs is turned on to provide the output current. In this way, the single current source may be controllably steered to the collector circuit of any one of the four transistors in the second and third transistor pairs, as desired. In this circuit, however, the steering circuit increases the headroom already required by the current source being steered by a minimum of $2V_{CESAT}$, where $V_{CETSAT}$ is the minimum collector-emitter voltage required by a transistor to stay out of the saturation region of operation. Further, assuming the transistors are bipolar junction transistors, the beta dependent base current of whichever transistor of the first transistor pair is turned on adds to (or subtracts from, depending on the conductivity type of the transistor) the current from the current source, so that the collector current of that transistor will be different from that of the current source by the amount of the respective base current. Also, whichever transistor of the second and third transistor pairs is on and conducting collector current of the transistor of the first transistor pair will similarly inject a beta dependent error. Thus, particularly because of the temperature dependent variation in beta of a typical transistor, it is desirable to minimize the number of beta dependent errors which accumulate in the steered current output. Of course, while MOS transistors are not subject to such errors, it is still desirable to minimize the number of MOS transistors a current source must flow through to its ultimate steered current, from headroom and area considerations, particularly when the steered current is large.

BRIEF SUMMARY OF THE INVENTION

Minimal headroom, minimal area, multi-terminal current steering circuits for steering a current from a current source to any one of a plurality of outputs. The steering circuit provides controls to individual steering transistors so as to turn on the selected one of the plurality of steering transistors responsive to steering control signals. Minimal headroom is required, and beta dependent errors in the current output are minimized, by steering the current source through only a single transistor to the selected output. This also minimizes chip area.

DETAILED DESCRIPTION OF THE INVENTION

Figure 1:
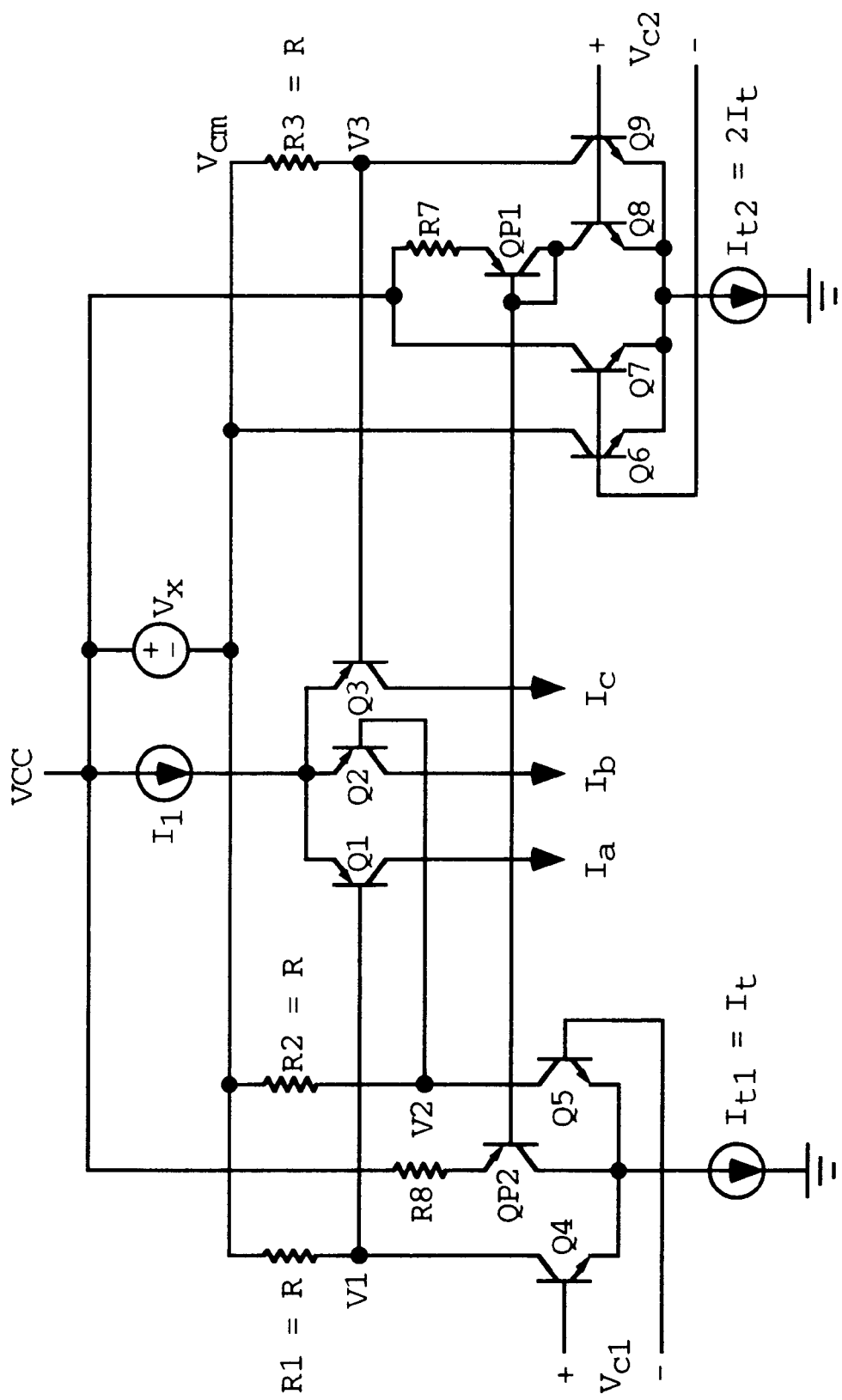
FIG. 1 is a circuit diagram illustrating a preferred embodiment of the present invention.

First referring to FIG. 1, the current of current source $I_1$ will be provided as output current $I_a$, $I_b$ or $I_c$, depending upon which one of transistors Q1, Q2 and Q3 is turned on. While the output currents $I_a$, $I_b$ and $I_c$ in the preferred embodiment are used as tail currents to select one of three different output stages for a particular integrated circuit, obviously these currents may be used for other purposes also.

The current steering control circuit shown in FIG. 1 is controlled by differential current steering control signals $V_{C1}$ and $V_{C2}$. The supply voltage for these control circuits is provided by the voltage $V_{cm}$, typically a predetermined voltage $V_X$ below the positive supply voltage VCC. In the control circuit of FIG. 1, npn transistors Q4 and Q5 each have load resistors R1 and R2 in their collector circuits, respectively, with the common emitter connection thereof having a tail current $I_{t1}=I_t$. Npn transistors Q6 through Q9 have their emitters connected in common and to a tail current source $I_{t2}=2I_t$, with transistor Q9 also having a load resistor R3 in its collector circuit. In the preferred embodiment, resistors R1, R2 and R3 are equal resistors, each having a resistance equal to R. In the description to follow, transistors Q4 and Q5 are of the same size. Also, npn transistors Q6 through Q9 are of the same size, pnp transistors QP1 and QP2 are of the same size, and emitter degeneration resistors R7 and R8 are have the same resistance value.

When the differential control voltage $V_{C2}$ is less than zero (the positive input of the control voltage $V_{C2}$ being lower than the negative input of the control voltage VC2), transistors Q6 and Q7 are turned on and transistors Q8 and Q9 are turned off. Because transistors Q6 and Q7 are the same size, one-half of the tail current ($I_{t2}$) flows through transistor Q6 and one-half of the tail current ($I_{t2}$) flows through transistor Q7. With transistor Q9 off, resistor R3 pulls the voltage V3 high (to $V_{cm}$) to turn off transistor Q3.

With transistor Q8 turned off, transistor QP1 does not mirror any current to transistor QP2. Consequently, the tail current $I_{t1}$ will be provided to transistors Q4 and Q5. More particularly, with the differential control voltage $V_{C1}$ positive, transistor Q4 is turned on and transistor Q5 is turned off, so that all of the tail current $I_{t1}$ flows through transistor Q4. The value of the resistor R1, and thus resistors R2 and R3, is chosen in relation to $I_t$ such that the current $I_t$ through resistor R1 holds the voltage V1 sufficiently low to turn on transistor Q1 to provide the output current $I_a$ and shutdown Q2 and Q3 such that $I_b$ and $I_c$ are less than the desired off value.

If, however, the differential control voltage $V_{C1}$ is negative, transistor Q5 will be turned on and transistor Q4 will be turned off so that all the tail current $I_{t1}$ will flow through transistor Q5. Now resistor R1 pulls the voltage V1 high and the tail current through resistor R2 pulls the voltage V2 low to turn on transistor Q3 to provide the output current $I_b$.

When the differential control voltage $V_{C2}$ is positive (the positive terminal being at a greater voltage than the negative terminal), transistors Q8 and Q9 are turned on and transistors Q6 and Q7 are turned off. Consequently, the tail current $2I_t$ is provided equally by transistors Q8 and Q9. Thus, a current $I_t$ flows through resistor R3, pulling the base of transistor Q3 sufficiently low to turn on transistor Q3. At the same time, the current $I_t$ in transistors Q8 and QP1 is mirrored by transistor QP1 to transistor QP2, thereby providing the full tail current $I_t$ for the current source $I_{t1}$. Consequently, independent of the state of the control voltage $V_{C1}$, the tail current component for transistors Q4 and Q5 will be substantially zero, or at least sufficiently low so that the voltages V1 and V2 will both remain sufficiently high to hold transistors Q1 and Q2 off. Thus, under this condition, the currents $I_a$ and $I_b$ are zero, with the current $I_1$ being steered by the turn-on of transistor Q3 to provide the output current $I_c$.

As may be seen from FIG. 1, the current $I_1$ is steered by transistors Q1, Q2 or Q3 to provide any one of the three current outputs $I_a$, $I_b$ and $I_c$, while adding only a single $V_{CESAT}$ to the steered current, namely the $V_{CESAT}$ of whichever one of transistors Q1, Q2 and Q3 is turned on, to the headroom needed by the current source $I_1$. Further, there is no compounding of beta dependent errors as in the prior art, with only the base currents of transistors Q1, Q2 or Q3 affecting the output current $I_a$, $I_b$ or $I_c$ in relation to the current source $I_1$.

Figure 2:
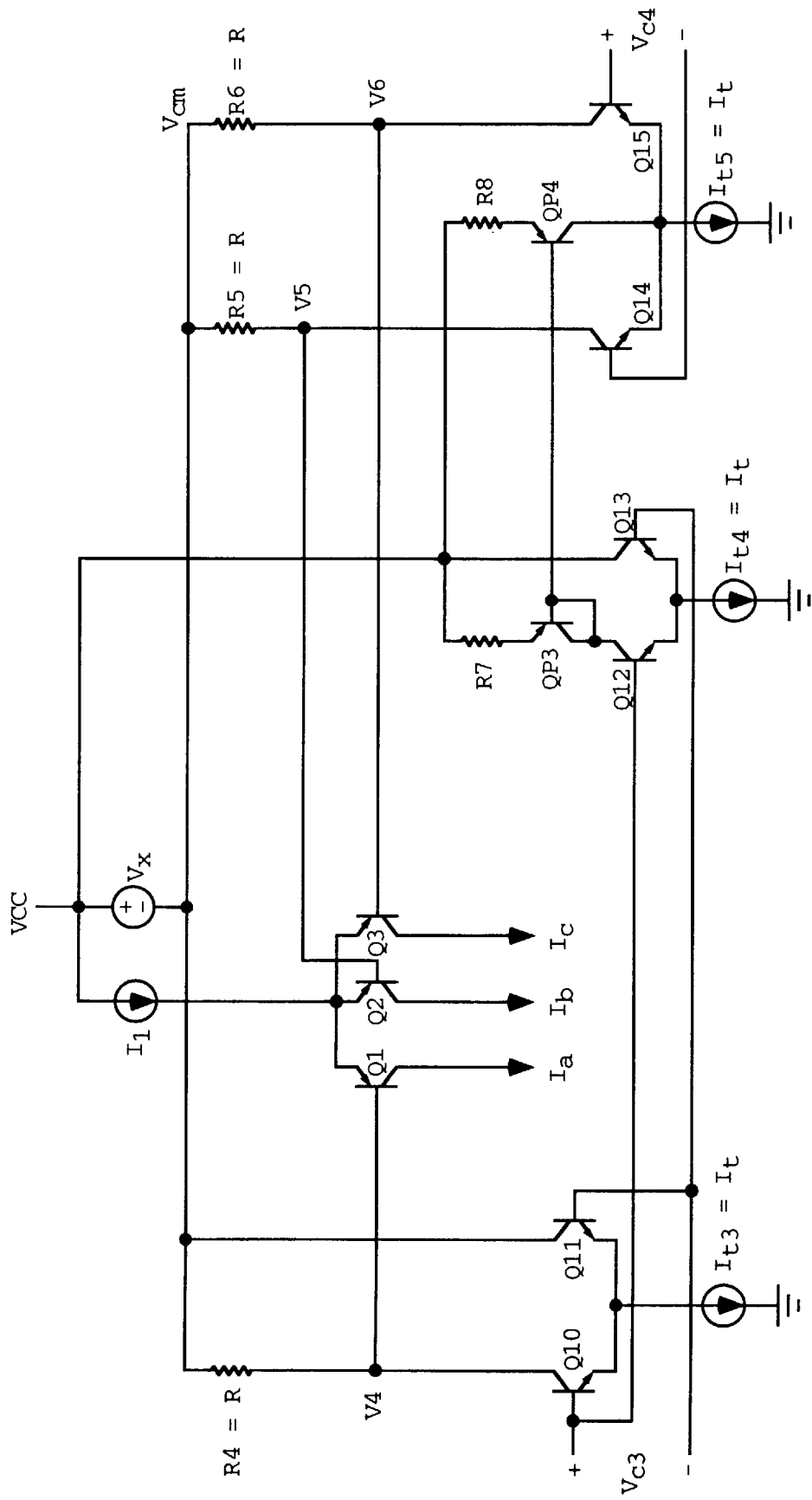
FIG. 2 is a circuit diagram illustrating an alternate preferred embodiment of the present invention.

Now referring to FIG. 2, an alternate preferred embodiment of the present invention may be seen. Like the circuit of FIG. 1, the purpose of the circuit of FIG. 2 is to selectively steer the current source $I_1$ through transistors Q1, Q2 or Q3 to provide the output current $I_a$, $I_b$ or $I_c$, as desired. In this circuit, three tail current sources are provided, $I_{T3}$, $I_{T4}$ and $I_{T5}$, all three of which provide the same amount of tail current $I_T$. These tail current sources $I_{T3}$, $I_{T4}$ and $I_{T5}$ provide tail current to differential transistor pairs Q10 and Q11, Q12 and Q13, and Q14 and Q15, respectively. Differential pairs Q10 and Q11, and Q12 and Q13, are both controlled by a differential control voltage $V_{C3}$, whereas differential pair Q14 and Q15 is controlled by the differential voltage $V_{C4}$. When the differential control voltage $V_{C3}$ is positive (the positive input being higher than the negative input of the control voltage), transistor Q10 will be turned on, pulling the voltage $V_4$ low to turn on transistor Q1 to steer the current source $I_1$ to the output $I_a$. At the same time, transistor Q11 will be turned off, transistor Q12 will be turned on and transistor Q13 will be turned off. With transistor Q12 on and transistor Q13 off, the tail current $I_{T4}$ will flow through transistor Q12, diode-connected transistor QP3 and resistor R7, being mirrored by transistor QP3 and resistor R7 to transistor QP4 and resistor R8 (resistors R7 and R8 being of equal value and transistors QP3 and QP4 being of the same size). Thus, the tail current $I_{T4}$ is mirrored to provide the tail current $I_{T5}$. Therefore, independent of the state of the differential control voltage $V_4$, neither transistor Q14 nor Q15 will conduct significant current, so that the pull-up resistors R5 and R6 will hold the voltages V5 and V6 high, holding transistors Q2 and Q3 off.

When the differential control voltage $V_{C3}$ is negative (the negative input exceeding the positive input of the control voltage), transistors Q10 and Q12 will be turned off and transistors Q11 and Q13 will be turned on. With transistor Q10 turned off, the pull-up resistor R4 will hold the voltage V4 high, holding transistor Q1 off. With transistor Q12 off, no current will flow through transistor QP3 and resistor R7, and accordingly no current will be mirrored to transistor QP4 and resistor R8. Now the differential pair Q14 and Q15 will determine which of transistors Q2 and Q3 is turned on, dependent upon the state of the differential control voltage $V_{C4}$. With the differential control voltage $V_{C4}$ positive (the positive input being higher than the negative input), transistor Q15 is turned on and transistor Q14 is turned off. With transistor Q15 on, the tail current $I_{T5}$ will flow through resistor R6, pulling the voltage V6 low to turn on transistor Q3 to provide the output current $I_c$. At this time, with transistor Q14 off, the pull-up resistor R5 will hold the voltage V5 high, holding transistor Q2 off. If, on the other hand, the differential control voltage $V_{C4}$ is negative, transistor Q15 will be turned off and transistor Q14 will be turned on. Now the pull-up resistor R6 will pull the voltage V6 high, turning off transistor Q3. At the same time, the tail current $I_{T5}$, going through transistor Q14 and resistor R5, will pull the voltage V5 low, turning on transistor Q2 to direct the current source $I_1$ to the output current $I_b$.

As with the steering circuit of FIG. 1, the control circuit providing the control voltages to transistors Q1, Q2 and Q3 does not itself impose any independent errors nor additional $V_{CESAT}$ on that required by transistors Q1, Q2 and Q3 themselves. The circuit still allows the steering of the current source $I_1$ to either of the three current outputs $I_a$, $I_b$ or $I_c$ using logic signals for the differential control voltages $V_{C1}$ and $V_{C2}$ of FIG. 1, or $V_{C3}$ and $V_{C4}$ of FIG. 2. In these circuits, the value of $I_T*R$ determines $I_{on}/I_{off}$ at a given temperature. Also, because the steered current only flows through one steering transistor, rather than two or more in series, low area transistors may be used for the steering transistors, minimizing the circuit area required for the steering circuit. Furthermore, multiple mirroring of the tail current $I_1$ is avoided, resulting in minimum area and minimum beta-dependent errors.

The circuits of FIGS. 1 and 2 are very similar. In particular, in the circuit of FIG. 1, the tail current $I_{T2}$, which is equal to $2I_T$, will divide equally between transistor pair Q6 and Q9, and transistor pair Q7 and Q8 (assuming all four transistors are of the same size) because of the equal base emitter voltages on transistors Q6 and Q7 and equal base emitter voltages on transistors Q8 and Q9. Thus, the circuits associated with transistor pair Q6 and Q9 may be separated from the circuit associated with transistor pair Q7 and Q8, as in FIG. 2, with each of the transistor pairs having a tail current equal to $I_T$.

While the two specific embodiments of the present invention disclosed herein are for current steering to one of three outputs, the concept of the present invention may be readily extended to steer a given current source to any one of a larger number of outputs. By way of but one example, referring again to FIG. 2, the circuit portion comprised of transistors Q10 and Q11, resistor R4 and tail current source $I_{T3}$ determines whether the steering transistor Q1 is selected or not. The circuit portion comprised of transistors Q12, Q13 and QP3, resistor R7 and tail current source $I_{T4}$, determines whether the circuit portion comprised of transistors Q14, Q15 and QP4, resistor R8 and tail current source $I_{T5}$ is active, that latter circuit when active selecting between steering transistors Q2 and Q3. Consequently, the circuit comprised of transistors Q10 and Q11, resistor R4 and tail current source $I_{T3}$, could be replaced by a circuit similar to that associated with transistors Q12, Q13, Q14 and Q15, etc., so as to determine whether the circuit selecting between transistors Q2 and Q3 was active, or another such circuit selecting not merely a single transistor such as transistor Q1, but rather selecting between one of two additional transistors, was active, thereby providing four way selective current steering. Further expansions in the current steering capability of the present invention will be obvious to those skilled in the art.

In the embodiments specifically disclosed herein, the steering transistors are pnp bipolar transistors. However it is to be understood that the same could be npn transistors, or other types of transistors of either conductivity type, such as by way of example, MOS transistors. Similarly, the detailed circuit designs may be altered by those skilled in the art without deviating from the invention. Thus, while preferred embodiments of the present invention have been disclosed and described herein, it will be obvious to those skilled in the art that various changes in form and detail may be made therein without departing from the spirit and scope of the invention.

What is claimed is:

1. A current steering circuit comprising:

first, second, and third transistors, each having first and second regions, and a control region turning the conduction between the first and second regions on and off responsive to the voltage between the control region and the first region;

the first regions of the first and second transistors being coupled to a first current source to be selectively steered to the second regions of the first and second transistors;

a first subcircuit responsive to a first steering control signal to selectively turn on the first or the second transistor when the first subcircuit is active; and a second subcircuit responsive to a second steering control signal to select between making the first subcircuit active and the third transistor off, and making the first subcircuit inactive and the third transistor on.

2. The current steering circuit of claim 1 wherein the first subcircuit comprises fourth and fifth transistors having their first regions coupled together and to a second current source, the first steering control signal being coupled to the control region of the fourth and fifth transistors with the current in the second regions of the fourth and fifth transistors turning the first and second transistors on and off respectively, the second subcircuit being coupled to the first regions of the fourth and fifth transistors and responsive to the second steering control signal to selectively provide the current of the second current source.

3. The current steering circuit of claim 1 wherein the transistors are bipolar junction transistors.

4. A current steering circuit comprising:

first, second, third, fourth and fifth transistors, each having first and second regions and a control region turning the conduction between the first and second regions on and off responsive to the voltage between the control region and the first region;

the first regions of the first, second and third transistors being coupled to a current source to be selectively steered to the second regions of the first, second or third transistors;

a first subcircuit including the fourth and fifth transistors having their first regions coupled together and to a second current source, the control regions of the fourth and fifth transistors being responsive to a first steering control signal to selectively turn on either of the fourth and fifth transistors, the current in the fourth and fifth transistors turning on the first and second transistors, respectively and;

a second subcircuit coupled to the first regions of the fourth and fifth transistors and responsive to a second steering control signal to selectively provide a current thereto equal to the second current source, the second subcircuit also being responsive to the second steering control signal to selectively turn on the third transistor.

5. The current steering circuit of claim 4 wherein the second subcircuit comprises sixth and seventh transistors, each having first and second regions and a control region turning the conduction between the first and second regions on and off responsive to the voltage between the control region and the first region, and a current mirror;

the sixth and seventh transistors having their first regions coupled together and through a third current source;

the sixth transistor having its second region coupled to the current mirror to mirror the current in the second region of the sixth transistor to the common coupling of the sixth and seventh transistors in an amount substantially equal to the current of the second current source and;

the control regions of the sixth and seventh transistors being coupled to the second steering control signal.

6. The current steering circuit of claim 5 wherein the second subcircuit further comprises eighth and ninth transistors, each having first and second regions and a control region turning the conduction between the first and second regions on and off responsive to the voltage between the control region and the first region;

the eighth and ninth transistors having their first regions coupled together and to a fourth current source, and their control regions coupled to the second steering control signal and;

the current in the second region of the ninth transistor being coupled to turn on the third transistor.

7. The current steering circuit of claim 4 wherein the transistors are bipolar junction transistors.

* * * * *